United States Patent
Duroux et al.

(10) Patent No.: US 7,511,874 B2
(45) Date of Patent: Mar. 31, 2009

(54) ELECTROCHROMIC CELL, ITS USE IN THE REALIZATION OF A GLASS PANE OR A REAR-VIEW MIRROR AND ITS REALIZATION METHOD

(76) Inventors: Bernard Duroux, 19 Domaine de la Boissiere, Garancieres (FR) 77890; Allan Billard, 227, rue Jeanne d'Arc, Nancy (FR) 54000; David Howart, 6, re due General Haxo, Nancy (FR) 54000

( * ) Notice: Subject to any disclaimer, the term of this patent is extended or adjusted under 35 U.S.C. 154(b) by 0 days.

(21) Appl. No.: 11/755,054

(22) Filed: May 30, 2007

(65) Prior Publication Data

US 2008/0144162 A1      Jun. 19, 2008

(30) Foreign Application Priority Data

May 30, 2006    (FR) ................... 06 04827

(51) Int. Cl.
  *G02F 1/153*     (2006.01)
  *G02F 1/155*     (2006.01)
  *G02F 1/15*      (2006.01)
(52) U.S. Cl. .................... 359/273; 359/267; 359/265
(58) Field of Classification Search ................ 359/265, 359/266, 267, 270, 273
  See application file for complete search history.

(56) References Cited

U.S. PATENT DOCUMENTS

| | | | |
|---|---|---|---|
| 4,049,891 A | 9/1977 | Hong et al. | |
| 4,258,984 A | 3/1981 | Beni et al. | |
| 4,297,005 A | 10/1981 | Johnson, Jr. et al. | |
| 4,346,964 A * | 8/1982 | Ishihama et al. | ............ 359/266 |
| 4,504,120 A | 3/1985 | von Alpen et al. | |

FOREIGN PATENT DOCUMENTS

| | | |
|---|---|---|
| DE | 3016524 | 11/1981 |
| EP | 1 862 849 A1 * | 12/2007 |
| GB | 1591234 | 6/1981 |

OTHER PUBLICATIONS

D.Howart; A. Billard, Sodium Superionic Conductor Sputter-Deposited Coatings, Jan. 2005, pp. 120-125; vol. 11, XP009076259; ISSN: 0947-7047; Ionics Inst. Ionics Germany.

* cited by examiner

*Primary Examiner*—David N Spector

(57) ABSTRACT

The present invention concerns an electrochromic cell comprising a layer (4) of electrochromic material to which an electrolyte layer (3) is applied, means (7, 8, 9) being designed to establish a potential difference between these layers; said electrolyte comprises at least one compound of general formula:

$$Na_{1+x}Zr_2Si_xP_{3-x}O_{12} \qquad (1)$$

in which x is chosen to respond to the following conditions: 1, $6 \leq x \leq 2, 4$. The present invention also concerns a glass pane or a rear-view mirror including such a cell.

25 Claims, 2 Drawing Sheets

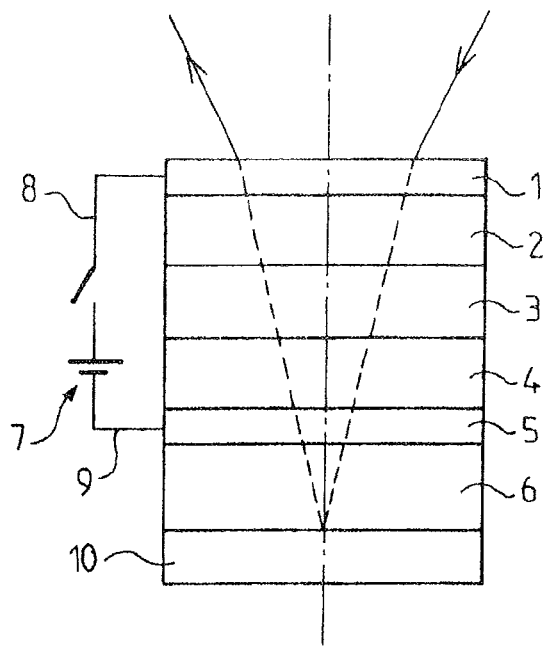
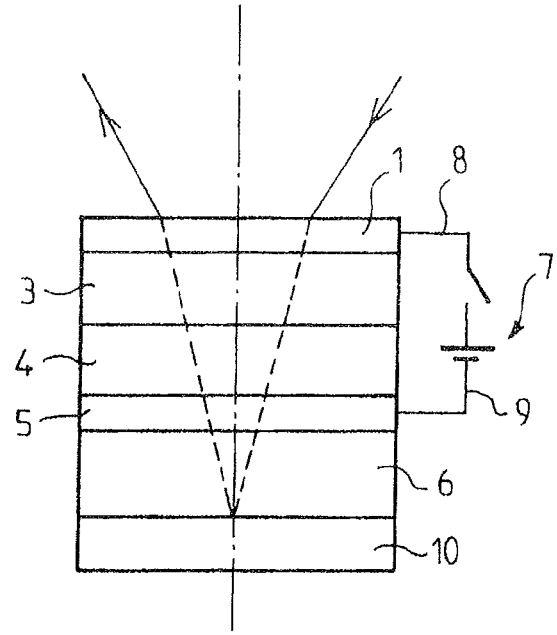
FIG.1　　　FIG.2
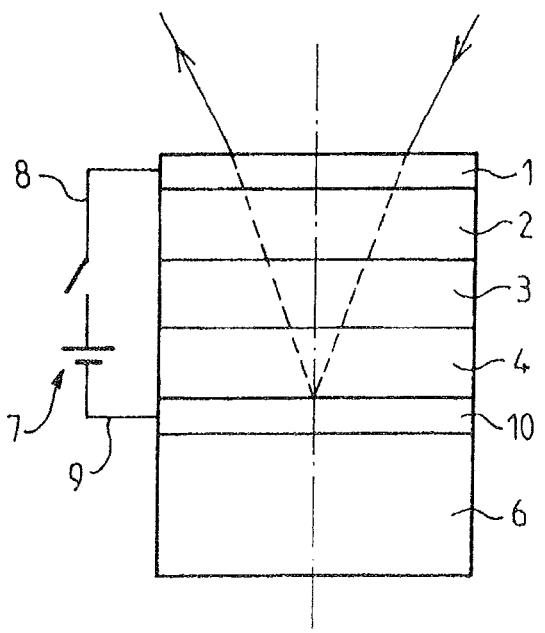
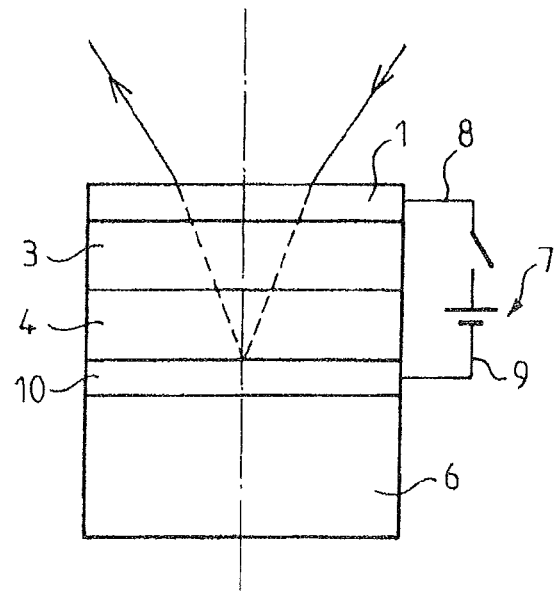
FIG.3　　　FIG.4

ELECTROCHROMIC CELL, ITS USE IN THE REALIZATION OF A GLASS PANE OR A REAR-VIEW MIRROR AND ITS REALIZATION METHOD

BACKGROUND ART

1. Field of the Invention

The invention relates to an electrochromic cell for a rear-view mirror. More particularly, the invention relates to an electrochromic cell for a rearview mirror including a stack of layers consisting of a layer of inorganic and transparent electrochromic material.

2. Description of the Related Art

An electrochromic cell typically includes layers of an inorganic and transparent electrolyte designed to establish a potential difference between these layers and the electrochromic material, and the electrolyte being chosen so that under the influence of this potential difference, cations migrate in a reversible way from the electrolyte towards the electrochromic material in order to be inserted into this last causing a modification of its power of absorption of the light.

It also concerns applications of this cell and a realization method of this one. In the known electrochromic cells of above-mentioned type, use is generally made, as electrochromic materials, of transition metal compounds, particularly, the tungsten oxide ($WO_3$) and vanadium oxide ($V_2O_5$).

These last two materials are indeed likely to integrate, by insertion, cations such as for example (Fr), $Li^+$, $Na^+$ and $K^+$ protons.

This insertion is accompanied by a chemical modification of materials, at the origin of a change of color, that is to say of an increase in the capacity of absorption of the light.

Thus, for example, $WO_3$ is colorless in a normal state and, due to the insertion of cations, is transformed into a colored complex with blue color.

It should be added that the insertion of cations is obtained by choosing the above-mentioned electrolyte so that this one, under the influence of a potential difference between this electrolyte and the electrochromic material, liberates cations, which come to be inserted in the electrochromic material.

It should be specified that this phenomenon of insertion is reversible, in the sense that by applying a potential difference inverse to the one causing the insertion of cations, there is migration of these same cations in return towards the electrolyte, which is accompanied by the transformation of the above-mentioned colored complex into colorless $WO_3$.

In the known cells of above-mentioned type, the electrolyte is constituted of a solid, organic or inorganic ionic conductor.

However, stacks consisting of an organic ionic conductor, such as polymer, are difficult to realize with a high degree of precision and uniformity of thickness because of the liquid or pasty characteristics of this type of conductor, characteristics which are given to it due to the presence of solvents; this lack of precision and uniformity is at the origin of the formation of marbling during the polarization of the stack.

Furthermore, the stage of realization of the layer of organic ionic conductor (injection of the conductor in the space formed between two glass layers with constant distance, then sealing this space) is not only difficult to implement, but also does not become integrated with the realization method of other layers of the stack, method which is a type of physical vapor deposition; it follows that two different manufacturing techniques are necessary to realize the stack, which complicates the manufacturing of this last.

Moreover, in the case of inorganic ionic conductors such as hydrated $Ta_2O_5$: H, ionic conduction varies in an extremely fast way with the degree of hydration; it is consequently essential to watch out that the preparation conditions of such hydrated conductor allow to acquire, in a precisely and reliably way, the desired degree of hydration, which is extremely difficult in the industry scale.

SUMMARY OF THE INVENTION

The object of the present invention is to overcome the disadvantages listed above and to this effect it is proposed an electrochromic cell being characterized in that the cations are $Na^+$ cations and the electrolyte comprises at least one compound of general formula:

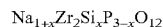

$$Na_{1+x}Zr_2Si_xP_{3-x}O_{12}$$

in which x is chosen to respond to the following conditions: $1,6 \leq x \leq 2,4$, x being preferably approximately equal to 2.

BRIEF DESCRIPTION OF DRAWINGS

Several forms of execution of the invention are described below as illustrative examples, in reference to the annexed schematic drawings in which:

FIG. 1 is a cross section of an electrochromic cell with transparent support and reserve of $Na^+$ cations, FIG. 2 is a cross section of an electrochromic cell with transparent support and without reserve of $Na^+$ cations, FIG. 3 is a cross section of an electrochromic cell with opaque support and reserve of $Na^+$ cations, FIG. 4 is a cross section of an electrochromic cell with opaque support and without reserve of $Na^+$ cations.

DETAILED DESCRIPTION OF THE PREFERRED EMBODIMENT(S)

Figure 5:
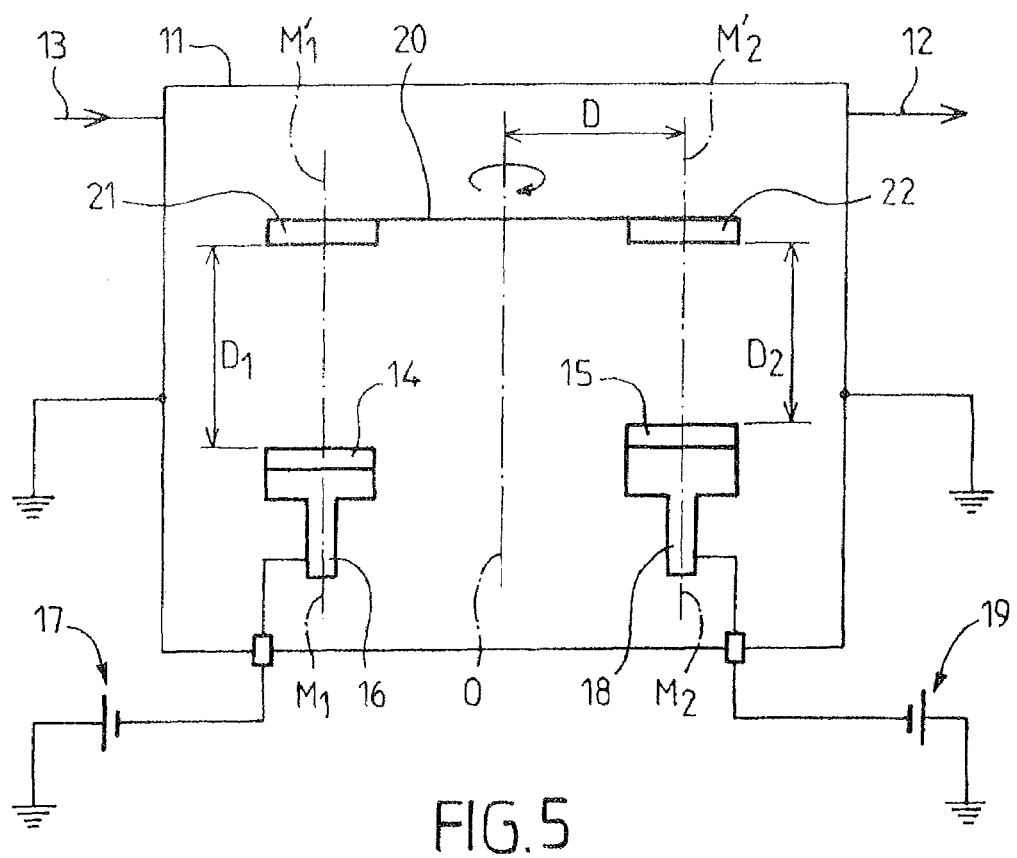
FIG. 5 is a schematic presentation of an installation of cathode sputtering with two targets and pivotable substrate carriers.

An electrochromic cell includes cations and, more specifically, $Na^+$ cations, and the electrolyte comprises at least one compound of general formula:

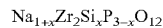

$$Na_{1+x}Zr_2Si_xP_{3-x}O_{12}$$

in which x is chosen to respond to the following conditions: $1,6 \leq x \leq 2,4$, x being preferably approximately equal to 2.

The electrolyte of above formula corresponds to NASICON (crystal form) or NASIGLAS (amorphous form) series, which are ionic conducting ceramics, the passage from amorphous form to crystal form being obtained by heat treatment.

Compared to electrolytes of former states of technique, i.e., the prior art, the compound of the above formula presents several advantages. The above compound is stable chemically, has good mechanical and conductivity properties (it lets passed $Na^+$ ions easily), and is operational at ambient temperature.

The elements are chosen such that its conductivity is not sensibly influenced by its degree of humidity.

Finally, as it hereafter shall be seen, its preparation method harmonizes perfectly together with the preparation method of other layers of the stack.

The electrochromic material of the cell according to the invention advantageously consists of tungsten oxide ($WO_3$) or vanadium oxide ($V_2O_5$), preference being given to $WO_3$.

In that case, the modification of the power of absorption of the light of electrochromic material corresponds to a change of color; colorless $WO_3$ and $V_2O_5$ in their normal state change under the effects of insertion into their centre of $Na^+$ cations, coming from the compound of formula (1), respectively in a blue colored complex and a brown colored complex.

The application of an inverse potential difference produces the 10 inverse effect, that is to say a migration in return from Na cations towards compound, which migration is accompanied by a transformation of the colored complexes respectively in colorless $WO_3$ and $V_2O_5$.

According to a realization mode, the cell includes moreover a layer of transparent material constituting a reserve of $Na^+$ cations, placed on the external side of the electrolyte layer, and endowed with properties of ionic conduction.

This reserve allows compensating a possible insufficiency of $Na^+$ cations coming from the electrolyte.

This same reserve can for example consist of some porous or not porous titanium oxide ($TiO_2$) and Na doped or an alumina β [from formula $(Na_2O)x(Al_{22}O_{33})_{1-x}$ with $0,15<x<0,3$].

Such compounds present the advantage to be not only ionic conductors, but also electronic conductors.

So they constitute a transition between the purely ionic conductor electrolyte and the purely electronic conductors means establishing a potential difference normally designed to be directly applied onto the electrolyte; this transition provides a much better operation of the cell and avoids the obligation of implementing a too high potential difference.

The above-mentioned means establishing a potential difference consist of a first transparent electrode placed on the external side of the electrochromic material layer and a second transparent electrode placed on the external side of the electrolyte layer or of the layer of the material constituting a reserve of $Na^+$ cations when this last is present, means being moreover designed to connect these electrodes to an electric power source.

Preferably, the means constituting the first and second electrodes are selected among aluminum doped zinc oxide (ZnO: Al), fluorine doped tin oxide ($SnO_2$:F) and indium and tin oxide (ITO).

The potential difference to be implemented should have to be at least equal to which one allowing the migration of $Na^+$ cations from the electrolyte and the reserve of $Na^+$ cations, and allowing their insertion in the electrochromic compound.

The more this potential difference will be high, and the more this migration, and thus the change of the capacity of absorption of the light, will be fast.

Favorably, the cell according to the invention includes moreover a support for the stack of layers and the means establishing a potential difference.

According to a first variant, this support is transparent, for example constituted of glass or transparent polymer such as polycarbonate, polystyrene or polyethylene terephtalate, and can be equipped on its external side with a reflective coating (for example a metal with reflecting surface).

According to a second variant, the support is opaque, for example constituted of polymer such as polybutadiene, and can be equipped with a reflective coating (for example metal with reflecting surface) placed on the side opposed to the external side of the support; it should be noted that if the reflective coating is made out of a electricity conducting material (metal), this coating been part of the means establishing a potential difference or constitutes the first electrode.

It should be added that in one or the other of both above-mentioned variants, the reflective coating, when constituted of electricity conducting material, can be part of a heating circuit whose function is the elimination of the white frost or the condensation possibly deposited on the cell.

The thicknesses of the different elements of the cell are preferably as follows:
electrochromic material layer: 200-600 nm
electrolyte layer: 200-1200 nm
layer of material constituting the reserve of $Na^+$ cations: 200-800 nm
first electrode: 100-500 nm
second electrode: 100-500 nm support: 1-3 mm
reflective coating: 700-1200 nm,
and the means establishing a potential difference are preferably selected to establish a 2-4 volt potential difference.

The electrochromic cell which has just been described finds various applications. So, when the support is out of glass, the cell can be part of a pane of glass.

The present invention thus extends to a window pane, in particular for vehicle, this window pane constituting the transparent support out of glass of the cell according to the first variant defined above and without reflective coating.

It should be understood that the implementation of the cell allows a fast adjustment of the thermal and brightness level wished inside a vehicle.

The cell can also be part of a rear-view mirror.

Consequently, the present invention extends moreover to a rear-view mirror for vehicle, including a unit reflecting the light constituted of the electrochromic cell from the first variant (with reflective coating) or the second variant (with reflective coating) defined above.

When the cell is not under operation, that is to say no potential difference is established, the rear-view mirror is in a very reflective state for a day use.

When a sufficient potential difference is established, it changes to a less reflective state for a night use in order to limit or remove the dazzling of a driver by the headlights of the following vehicles.

The present invention extends in addition to a manufacturing process of the electrochromic cell.

This method is characterized in that it consists of physical vapor deposition of the electrolyte layer by cathode sputtering, on at least one substrate constituted of an appropriate beforehand formed part of the cell and in an atmosphere with reduced pressure constituted of a neutral vector gas and of oxygen, on a first Si—Zr alloy target and a second $Na_3PO_4$ target, in order to form the compound of the formula defined above.

It should be understood that, considering the structure of the electrochromic cell according to the invention, the deposition of the compound must be performed on the layer of electrochromic material; so the external layer of the substrate should be able to be constituted of the electrochromic material, one of the electrodes or the reserve of $Na^+$ cations.

It should be noted that the Si—Zr alloy preferably consists of 40 to 60% moles of Si, that the volumic percentage of oxygen is preferably lower or equal to the volumic percentage of vector gas (for example, 5 to 10 parts in volume of oxygen for 20 parts in volume of vector gas) and that neutral vector gas is preferably argon.

The cathode sputtering can consist of the simultaneous cathode sputtering of both targets. In variant, cathode sputtering consists of an operation of cathode sputtering of one of the targets, followed by an operation of cathode sputtering of the other target, these operations being repeated in the same order.

During cathode sputtering, the electric discharge provokes the ionization of the vector gas with formation of ionized gas atoms (for example $Ar^+$) which come to hit the target (cathode). This leads to the ejection of superficial atoms of the target.

In the case of the Si—Zr target, atoms ejected from the target are transferred on the substrate to the surface of which they react with the oxygen present in plasmagene gas to form $SiO_2$ and $ZrO_2$ oxides.

The same is true for the $Na_3PO_4$ target which ejected atoms are directly transferred on the substrate without reaction with the present oxygen.

Cathode sputtering should have to be realized under conditions allowing the transfer on the substrate of a succession of mono-layers each one approximately constituted of two molecules of $ZrO_2$ and two molecules of $SiO_2$ for a molecule of $Na_3PO_4$, result to which the expert should be able to lead by choosing in an appropriated way different available parameters.

It should be noted here that the implementation of a unique target of compound of the above-mentioned formula led to a failure, no deposition having been able to be performed on the substrate due to a prohibitive heating of the target.

In the same way, the use of a target produced by sintering a mixture of one part of $Na_3PO_4$ powder, two parts of $ZrO_2$ powder and two parts of $SiO_2$ powder did not allow the deposition of the compound.

In fact, alone was crowned with success, the use of both the targets (Si—Zr and $Na_3PO_4$ alloys).

According to a mode of realization, the method includes a relative displacement between the targets and each substrate, between a first position in which there is principally reception on a substrate of the vapor emitted by the cathode sputtering of one of the targets and a second position in which there is principally reception on the same substrate of the vapor emitted by the cathode sputtering of the other target.

The displacement is preferably executed according to a closed trajectory, in particular according to a circle of axis (0).

In the case of the implementation of several substrates, the relative displacement between targets and substrates can be performed according to concentric circles of axis (0), targets (or substrates) being distributed on these That precedes shows that the electrochromic cell according to the present invention can be realized by implementation of only one type of process, the physical deposition in vapor phase and this, thanks to the concentric circles.

According to a variant, the median plan of a target, parallel to the axis (0), is approximately in the extension of the median plan of a substrate, parallel in the axis (0), when the target and the substrate are in the first position.

According to another variant, surfaces facing the targets and one or more substrates are approximately plane and parallels between themselves, and the shortest distance (D1, D2) between the plans containing respectively the surfaces is higher than D/2 and lower than 2D, D being the distance between the axis (0) and the median plan, parallel with this axis, of the considered target.

In addition, the speed of displacement between each target and the substrate should have to be selected to realize, as indicated previously, the deposition of a succession of mono-layers each one constituted approximately of two $ZrO_2$ molecules and two $SiO_2$ molecules for one $Na_3PO_4$ molecule.

For this purpose, in case the targets present each one a circular section taken according to a plan approximately perpendicular to the axis (0); this speed of relative displacement should preferably have to respond to the following relation:

$$\frac{VD'}{2pDw} \leq 1 \text{ nm}$$

in which:
V: deposition rate on the substrate (in nm/s)
D': diameter of the target (in cm)
D: distance between the axis (0) and median plan, parallel to this axis, of the target (in cm)
w: speed of relative displacement (in turns/s).

In addition, according to a possible mode of realization of the invention, the cathode sputtering of the Si—Zr alloy target is performed with a pulsed direct current with a frequency higher than 10 kHz and a current density of 20-60 $mA/cm^2$ and the cathode sputtering of the $Na_3PO_4$ target is performed with a pulsed direct current with a frequency higher than 200 kHz and a current density of 20-60 $mA/cm^2$, the tension applied being, in both case, of 175-450 V.

Finally, the realization method of the electrochromic cell can moreover consist of the physical deposition in vapor phase, of each other films, of the electrodes and the possible reflective surface of the electrochromic cell, except for the support.

The preceding shows that the electrochromic cell according to the present invention can be realized by implementation of only one type of process, the physical deposition in vapor phase and this, thanks to the particular choice of the electrolyte.

Compared to the processes of the former technique, it is possible according to the invention to obtain the electrolyte layer with a good precision and reproducibility of the thickness and of ionic conduction properties and to avoid difficulties met with the former techniques.

The method according to the invention allows moreover the use of different types of support (glass or opaque or transparent polymer) and in particular of polymer support lighter than the glass, avoiding the problems of vibration due to an excess of weight.

The use of polymer support allows realizing more complex forms than the glass, in addition the cells whose support is out of polymer are obviously much less fragile than the support out of glass.

Referring now to the Figures, the cell target of FIG. 1 consists of a stack including, in this order, an electrode 1, a layer 2 constituting the reserve of $Na^+$ cations, an electrolyte layer 3, a layer 4 of electrochromic material, an electrode 5 and a support 6.

This unit is supplemented by a battery 7 of which one 8 of terminals 8, 9 is connected to electrode 1 and the other 9 is connected to electrode 5.

According to the present invention, the electrolyte forming the layer 3 is in NASICON (crystal form) or in NASIGLAS (amorphous form), the electrochromic material forming the layer 4 is preferably in $WO_3$, the reserve of $Na^+$ cations forming the layer 2 is preferably in porous or not porous $TiO_2$ and doped with some % of Na, or in alumina β, the electrodes 1 and 5 are in ZnO:Al, $SnO_2$: F or ITO, and the support 6 is in transparent polymer, in particular in ABS, polycarbonate or polysulfone.

The cell thus formed consists moreover of a reflective coating 10 placed on the external side of the support 6; this coating is preferably constituted of a metal (for example, aluminium-titanium alloy, chromium or aluminium) with a reflecting surface.

Without a potential difference between electrodes 1 and 5, that is to say when the battery is not connected to these electrodes, $WO_3$ is colorless and its capacity of absorption of the light is minimum, the cell being then very reflective.

When the electrode 1 is connected to the positive terminal of the battery and the electrode 5 is connected to the negative terminal of the battery, $Na^+$ cations of the electrolyte migrate towards the $WO_3$ electrochromic material and come to form part of this last which changes from a colorless state to a blue colored state; it results an increase of the absorption capacity of the electrochromic material, the cell being then less reflective.

By reversing the commutation of the battery, the electrochromic material finds its initial colorless state.

It should be noted that for their part, $Na^+$ cations of the reserve forming the layer 2 migrate towards the electrolyte coming to occupy sites left by $Na^+$ cations having migrated to the electrochromic material, $Na^+$ cations coming to occupy these sites possibly being able themselves to migrate towards the electrochromic material.

The cell of FIG. 2 is in all points identical to the cell of FIG. 1, except that it does not include the layer 2 constituting the reserve of $Na^+$ cations; its operation is the same one as that of the cell of FIG. 1.

The cell of FIG. 3 is identical to the cell of FIG. 1, except that the support 6 is in an opaque polymer (for example, polycarbonate (PC), polysulfone (PSu), polyetherimide (PEI) or polycarbonate+ABS), that the electrode 5 is removed, that the relative positions of support 6 and reflective coating 10 are inverted compared to those which this support and this coating in the cell of FIG. 1 occupy, and that the coating 10 plays the role of the electrode 5, this coating 10 being then connected to the battery 7.

Regarding the cell of FIG. 4, it is identical to the cell of FIG. 3, except that it does not include a reserve of $Na^+$ cations.

The operation of the cells of FIGS. 3 and 4 is similar to the cell of FIG. 1.

It should be added that in cells of FIGS. 1 and 2, the sequence: layer 2 of $Na^+$ cations reserve—electrolyte layer 3—layer 4 of electrochromic material can be changed into the sequence: layer 4 of electrochromic material—electrolyte layer 3—layer 2 of $Na^+$ cations reserve, in which case the polarities of electrodes 1 and 5 should have to be inversed to obtain the same operation of the cell resulting from this modification of sequence.

This is also valid for the cells of FIGS. 3 and 4.

When in cells of FIGS. 1 and 2, the reflective coating 10 is leaving out and the support 6 is out of glass, these can be used as glass panes, for example vehicles window panes.

Furthermore, cells of FIGS. 1 to 4 can be used as reflective units (or mirrors) for rear-view mirrors.

Example 1

Electrochromic Cell in Accordance with FIG. 1 and Showing Following Characteristics electrode 1: in ZnO: Al and a thickness of 300 nm
layer 2 of $Na^+$ cations reserve: $Na_xTiO_2$ where x=0,25
layer 3 of NASICON: thickness of 800 nm
layer 4 in W03: thickness of 400 nm
electrode 5: in ZnO: Al and a thickness of 300 nm
support 6: in polymer ABS, polycarbonate or transparent polysulfone and a thickness of 2-3 mm
reflective coating 10: in aluminium-titanium alloy and a thickness of 1 µm
potential difference applied between electrodes 1 and 5 causing the change of color of $WO_3$ layer 4 (colorless->blue): 3 volts
increase of the absorption capacity of the layer 4, resulting from the application of the potential difference above: 35%
time necessary to obtain the increase in the above-mentioned absorption capacity: 20 seconds time necessary to regain the initial absorption capacity of layer 4, after potential commutation: 10 seconds.

The cathode sputtering installation of FIG. 5 consists of a chamber 11 supplied by a pipe 12 connected to a source of vacuum (not represented).

The chamber 11 is besides endowed with an inlet 13 of plasmagene gas mixture of argon and oxygen.

Inside and at the bottom part of the chamber 11, a first target 14 and a second target 15 are placed.

The target 14 is supported by an electric conducting element 16 (for example in stainless steel or copper) electrically connected to the cathode of an electric generator 17 of pulsed direct current of which the other terminal is grounded.

Also, the target 15 is supported by an electric conducting element 18 (for example in stainless steel or copper) electrically connected to the cathode of another electric generator 19 of pulsed direct current of which the other terminal is grounded.

The chamber 11 is also grounded.

Besides, inside and at the top of the chamber 11, a circular substrate carrier 20 is horizontally laid out and endowed with means (not represented) bringing it in rotation in a horizontal plan and around a vertical axis (0), with an adjustable speed.

Under and around the periphery of substrate carrier 20, substrates (or support) 21, 22 are fixed on which must be transferred, by cathode sputtering, respectively the matters of targets 14, 15. In addition, surfaces facing substrates 21, 22 and targets 14, 15 are approximately plane and horizontal.

It should be added that the targets 14, 15 have the shape of a disc and that each substrate 21, 22 can be constituted of a glass pane or a support of a rear view mirror, intended to receive a unit reflecting the light.

The relative positions of substrates 21, 22 and targets 14, 15 are selected so that during the rotation of substrate carrier 20, one of the substrates 21 passes successively above the first targets 14 then the second targets 15, whereas during the same time the other substrate 22 successively passes above the second target then the first target.

For this purpose, in a first position, the median plan $M'_1$ of substrate 21 parallel to the axis 0, is approximately in the extension of median plan $M_1$ of target 14 parallel to the axis 0, and median plan $M'_2$ of substrate 22 parallel to the axis 0 is approximately in the extension of plan median $M_2$ of target 15 parallel to the axis 0; in a second position, the median plan $M'_1$ of substrate 21 is approximately in the extension of the median plan $M_2$ of target 15, and the median plan $M'_2$ of substrate 22 is approximately in the extension of the median plan $M_1$ of target 14.

It is to note that the shape of the substrate carrier, the number of substrates and the position of these last on substrate carrier are in no way restricted to those represented on FIG. 5.

In fact, substrates can be in any number and occupy any position on and inside the circle of axis (0) delimited by the peripheral edge of substrate carrier 20.

This last can present any form on which the substrates could be distributed according to any disposition.

Thus, the substrate carrier can be for example constituted of a circular plate of axis (0) and substrates arbitrary distributed on this plate, for example on concentric circles of axis (0).

It should be here indicated that a substrate positioned on the axis (0) receives a constant material flow.

In the case of the extreme positions of substrates shown on FIG. 5, the material flow reaching a given substrate from a determined target varies in a regular way between a maximum value when the distance between target and substrate is minimum and a minimal value when the distance is maximum.

Moreover, a variant of the circular displacement of substrates 21, 22 would consist in envisaging linear and elongated formed targets and to move the substrates above these targets, according to a linear, bidirectional movement.

The above defined installation is used according to the invention to accomplish a deposition of a compound of the NASICON series and to this end, the first target is in Si—Zr alloy (with 40-60% of Si) and the second target is in $Na_3PO_4$.

It should be specified that substrates 21, 22 are each preferably constituted of the part of electrochromic cell intended to receive the electrolyte layer 3.

This part of the cell can include, in this order:
the transparent support 6, the electrode 5 and the layer 4 of the electrochromic material, or
the reflective coating 10, the transparent support 6, the electrode 5 and the layer 4 of the electrochromic material, or
the opaque support 6, the reflective coating 10 and the layer 4 of electrochromic material.

This installation works in the following way.

Vacuum is established inside the chamber 11, for example with a turbomolecular pump allowing obtaining a primary vacuum of about $10^{-4}$ Pa.

A plasmagene gas is then introduced into the chamber 11 through inlet 13, in order to obtain and maintain in the chamber a pressure of about 0,4 Pa.

Substrate carrier 20 is then brought in rotation. Then the conducting element 16 is connected to the cathode of the electrical generator 17 and the conducting element 18 with the cathode of the electrical generator 19.

The terminal voltages of respectively generators 17 and 19 are selected to obtain an electric discharge between the wall of the chamber 11 and respective targets 14, 15. These tensions are 175-450 Volts.

For the Si—Zr target, this tension is obtained with a generator 17 of pulsed direct current with a frequency higher than 10 kHz and for the $Na_3PO_4$ target, this tension is obtained with a generator 19 of pulsed direct current with a frequency of 200-350 kHz.

In addition, the current density by the targets is preferably about 20-60 $mA/cm^2$.

The $Ar^+$ species generated by discharges come to hit the targets which are then locally vaporized, the produced vapor coming to condense on the substrates.

Concerning the Si—Zr target 14, Si and Zr atoms are besides transformed into $SiO_2$ and $ZrO_2$ oxides, during the condensation on substrates.

The deposition on substrates must be accomplished in order to form on those a layer of NASICON, what implicates the deposition of two molecules of $SiO_2$ and two molecules of $ZrO_2$ for a molecule of $Na_3PO_4$.

For this reason, the rotating speed of substrate carrier 20 must be selected in an appropriate way that is to say not to form successive layers of $SiO_2$, $ZrO_2$ and $Na_3PO_4$, but a NASICON.

For this purpose, following relations must be respected as far as possible:

$$D/2 < D_1 \text{ or } D_2 < 2D$$

$$\frac{VD'}{2pDw} \leq 1 \text{ nm}$$

in which D is the distance between the axis (0) and median plan $M_1$, $M_2$, $D_1$ is the distance between surfaces facing substrate 21 and the target 14, $D_2$ is the distance between surfaces facing substrate 22 and the target 15 and the other different parameters have the same signification as those given in the above description.

It should be moreover specified that Si—Zr target 14 is obtained by sintering a Si and Zr powder mixture, at a temperature of 1000-1300° C. and under a pressure higher than 100 $kg/cm^2$ ($10^7$ Pa).

The $Na_3PO_4$ target 15 is obtained by cold pressing, with more than $10^8$ Pa, of an anhydrous $Na_3PO_4$ powder with a grain size lower than 200 pm.

Figure 6:
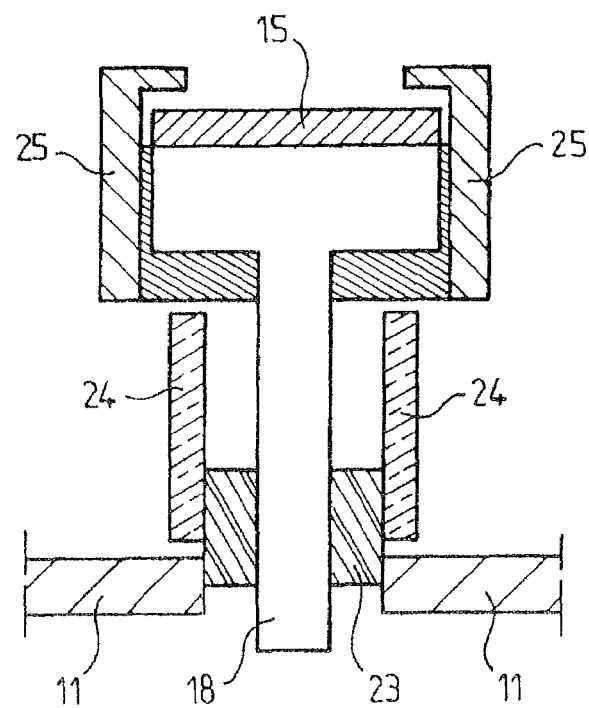
FIG. 6 is a detail view of one of the targets and its support.

Finally, FIG. 6 is a more detailed view of target 15/conducting element 18, according to another realization mode than FIG. 5.

So, the element 18 is extended on its base in order to expand up to the outside of the chamber 11, by crossing the lower wall of this last with interposition of an isolating element 23 (for example out of Teflon or Bakelite) between the element 18 and the wall.

In order to protect the deposition of NASICON formed on substrates 21, 22 from the contamination due to parasitic pulverizations of the insulating element 23 and the conducting material constituting the element 18, produced because of the high frequency of the current used for the $Na_3PO_4$ target 15, the insulating element 23 and the element 18 are surrounded by a protective covering 24 shaped to restrict, or even eliminate the access to substrates 21, 22 of the vapor from the conducting material of the element 18 and the vapor from the material of the insulating element 23.

A protective covering 25 is besides envisaged around the circular peripheral edge of each target to inhibit the material released from this edge during cathode sputtering. Protective coverings 24, 25 can be out of glass, fiber glasses or metal (for example iron) covered with glass or fiber glasses.

Example 2

Conditions of Cathode Sputtering of the Si—Zr Target (45% of Si)

distance D: 6 cm
distance D1: 9,5 cm
diameter of the target: 5 cm
w: 2 turns/s
plasmagene gas (Ar+$O_2$) pressure: 0,4 Pa—partial pressure of Ar in plasmagene gas: 0,3 Pa
current density: 36 $mA/cm^2$
pulsed current tension: 380 volts
pulsed current frequency: 20 kHz Example 3

Conditions of Cathode Sputtering of the $Na_3PO_4$ Target distance D: 6 cm
distance D1: 4,5 cm
diameter of the target: 5 cm
w: 2 turns/s
plasmagene gas (Ar+$O_2$) pressure: 0,4 Pa
partial pressure of Ar in plasmagene gas: 0,3 Pa
current density: 36 $mA/cm^2$
pulsed current tension: 300 volts
pulsed current frequency: 275 kHz All the other layers of the cell according to the invention, that is to say the layer 2 of Na+ cations reserve, the layer 4 of the electrochromic material, electrodes 1, 5 and the reflective coating 10, except the support 6, can according to the invention be each realized with the same technique of cathode sputtering as the one used to realize the electrolyte layer 3.

The expert should find any useful information in the documents of the former technique about targets and operating conditions to implement for the realization of these other layers, electrodes and coating, by cathode sputtering.

Thus, following informations are given as examples:
ZnO: Al electrode
simultaneously co-pulverized Zn target and Al target,
plasmagene gas: argon+$O_2$, with a proportion of $O_2$ from 2 to 30%,—plasmagene gas pressure: 0,3-0,8 Pa,
tension applied to Al target: pulsed current (20-100 kHz) of 100-200 V,
tension applied to Zn target: direct current of 300-450 V.
$WO_3$ layer
W target,
plasmagene gas: argon+$O_2$, with a proportion of $O_2$ from 15 to 40%,
plasmagene gas pressure: 2-4 Pa,
tension applied to W target: pulsed current (20-50 kHz) of 450-600V
$NaJiO_2$ layer ($Na^r$ reserve)
simultaneously co-pulverized Ti target and $Na_3PO_4$ target,—plasmagene gas: Argon+$O_2$, with a proportion of $O_2$ from 5 to 30%,
plasmagene gas pressure: 0,3-0,8 Pa (in the case of a dense product realization, and 2-4 Pa in the case of a porous product realization),
tension applied to $Na_3PO_4$ target: pulsed current (200-350 kHz) of 175-350 V,
tension applied to Ti target: direct current of 350-500 V.

The invention has been described in an illustrative manner. It is to be understood that the terminology, which has been used, is intended to be in the nature of words of description rather than of limitation.

Many modifications and variations of the invention are possible in light of the above teachings. Therefore, within the scope of the appended claims, the invention may be practiced other than as specifically described.

The invention claimed is:

1. Electrochromic cell switchably connected to a battery (7) between first (8) and second (9) terminals to create a potential difference therebetween, said electrochromic cell comprising:
   a first layer (4) of inorganic, transparent electrochromic material; and
   a second layer (3) of inorganic, transparent electrolyte having cations and defined light absorption characteristics such that said cations migrate from said second layer to said first layer when the potential difference is applied across said electrochromic cell to modify said defined light absorption characteristics and said cations migrate from said first layer to said second layer when the potential difference is removed from said electrochromic cell returning said second layer (3) to its defined light absorption characteristics wherein said cations are Na+ cations and said second layer (3) includes at least one compound defined by the of general formula:

$$Na_{1+x}Zr_2Si_xP_{3-x}O_{12}$$

in which x is chosen to respond to the following conditions: $1.6 \leq x \leq 2.4$.

2. An electrochromic cell according to claim 1, characterized in that x is approximately equal to 2.

3. An electrochromic cell according to claim 1, characterized in that said electrochromic material is constituted of tungsten oxide ($WO_3$) or vanadium oxide ($V_2O_5$).

4. An electrochromic cell according to claim 1, characterized in that it includes moreover a layer (2) of transparent material constituting a reserve of Na+ cations, placed on the external face of the electrolyte layer (3) and endowed with ionic conducting properties.

5. An electrochromic cell according to claim 4, characterized in that said material constituting a reserve of Na+ cations consists of porous or not porous titanium oxide ($TiO_2$) and Na doped or an alumina β.

6. An electrochromic cell according to claim 1, including a support (6) for said first (4) and second (3) layers.

7. An electrochromic cell according to claim 6, characterized in that the support (6) is transparent.

8. An electrochromic cell according to claim 6, characterized in that the support (6) is fabricated of a glass or a transparent polymer.

9. An electrochromic cell according to claim 6, characterized in that said support (6) includes an external face with a reflective coating (10).

10. An electrochromic cell according to claim 6, characterized in that said support (6) is opaque and equipped with a reflective coating (10) placed on a side facing said first layer (4).

11. An electrochromic cell according to claim 10, characterized in that said reflective coating (10) is an electric conductor and been part of said means establishing a potential difference or constitutes said first electrode (5).

12. An electrochromic cell according to claim 6, characterized in that said first layer defines a thickness in the range of 300-500 nm and said second layer defines a thickness in the range of 300-1200 nm.

13. Method of making the electrochromic cell having a first layer of electrochromic material and a second layer of electrolyte material, the method including the steps of: physical vapor depositing of the second layer (3) by cathode sputtering, on at least one substrate constituted of a beforehand formed part of the cell and in an atmosphere with reduced pressure constituted of a neutral vector gas and of oxygen, a first Si—Zr alloy target (14) and a second $Na_3PO_4$ target (15), in order to form the compound of the formula $$Na_{1+x}Zr_2Si_xP_{3-x}O_{12}.$$

14. Method according to claim 13, characterized in that Si—Zr alloy consists of 40 to 60% moles of Si.

15. Method according to claim 13, characterized in that the volumic percentage of oxygen is lower or equal to the volumic percentage of vector gas.

16. Method according to claim 13, characterized in that the cathode sputtering includes simultaneous cathode sputtering of the two targets.

17. Method according to claim 13, characterized in that the cathode sputtering includes an operation of cathode sputtering of one of the targets, followed by an operation of cathode sputtering of the other target, these operations being repeated in the same order.

18. Method according to claim 13, characterized in that it includes a relative displacement between the targets and each substrate between a first position in which there is principally reception on a substrate of the vapor emitted by the cathode sputtering of one of the targets and a second position in which there is principally reception on the same substrate of the vapor emitted by the cathode sputtering of the other target.

19. Method according to claim 18, characterized in that the relative displacement is performed according to a circle of axis (O).

20. Method according to claim 19 implementing several substrates, characterized in that the relative displacement between targets and substrates is performed according to concentric circles of axis (O), targets or substrates being distributed on these concentric circles.

21. Method according to claim 19, characterized in that the median plan of a target, parallel to the axis (O), is approximately in the extension of the median plan of a substrate, parallel to the axis (O), when said target and said substrate are in said first position.

22. Method according to claim 19, characterized in that the surfaces facing the targets and one or more substrates are approximately plane and parallels between themselves and characterized in that the shortest distance ($D_1$, $D_2$) between the plans containing respectively said surfaces is higher than D/2 and lower than 2D, D being the distance between said axis (O) and median plan, parallel with this axis, of the considered target.

23. Method according to claim 19, in which the targets present each one a circular section taken according to a plan approximately perpendicular to the said axis (O), characterized in that the speed of relative displacement is chosen to respond to the following relation: $VD'2 p D w \leq 1$ nm in which: V: deposition rate on the substrate (in mn/s) D': diameter of the target (in cm) D: distance between the axis (O) and median plan, parallel to this axis, of the target (in cm) w: speed of relative displacement (in turns/s).

24. Method according to claim 13, characterized in that the cathode sputtering of the Si—Zr alloy target is performed with a pulsed direct current with a frequency higher than 10 kHz and a current density of 20-60 mA/cm$^2$ and the cathode sputtering of the $Na_3PO_4$ target is performed with a pulsed direct current with a frequency higher than 200 kHz and a current density of 20-60 mA/cm$^2$, the tension applied being, in both case, of 175-450V.

25. Method according to claim 13, characterized in that it consists of moreover the physical deposition in vapor phase by cathode sputtering, of each other layers, of the electrodes and the possible reflective surface of the electrochromic cell, except for the support.

* * * * *